US012762314B2

(12) United States Patent
Koenig et al.

(10) Patent No.: US 12,762,314 B2
(45) Date of Patent: Oct. 13, 2026

(54) INTEGRATED CIRCUIT GENERATOR USING A PROVIDER

(71) Applicant: SiFive, Inc., San Mateo, CA (US)

(72) Inventors: Jack Koenig, Berkeley, CA (US); Megan Wachs, San Francisco, CA (US); Henry Cook, Berkeley, CA (US)

(73) Assignee: SiFive, Inc., Santa Clara, CA (US)

(*) Notice: Subject to any disclaimer, the term of this patent is extended or adjusted under 35 U.S.C. 154(b) by 809 days.

(21) Appl. No.: 18/197,422

(22) Filed: May 15, 2023

(65) Prior Publication Data

US 2024/0211665 A1 Jun. 27, 2024

Related U.S. Application Data

(60) Provisional application No. 63/434,806, filed on Dec. 22, 2022.

(51) Int. Cl.
*G06F 30/327* (2020.01)

(52) U.S. Cl.
CPC .................................. *G06F 30/327* (2020.01)

(58) Field of Classification Search
USPC .......................................................... 716/100
See application file for complete search history.

(56) References Cited

U.S. PATENT DOCUMENTS

| | | | | |
|---|---|---|---|---|
| 11,151,301 | B2 * | 10/2021 | Wachs | G06F 30/333 |
| 2012/0131257 | A1 * | 5/2012 | Rudosky | H03K 19/17756 711/170 |
| 2016/0246911 | A1 * | 8/2016 | Subramaniam | G06F 30/20 |
| 2019/0384884 | A1 * | 12/2019 | Thuries | G06F 30/327 |
| 2021/0374321 | A1 * | 12/2021 | Schaffer | G06F 30/392 |
| 2024/0211665 | A1 * | 6/2024 | Koenig | G06F 30/327 |

* cited by examiner

*Primary Examiner* — Mohammed Alam
(74) *Attorney, Agent, or Firm* — Kilpatrick Townsend & Stockton LLP

(57) ABSTRACT

A system may provide a placeholder for a component in a block of a first-level integrated circuit design without wiring at least one port of the component. The system may determine a mapping to a provider interface in the block. The system may invoke an integrated circuit generator to generate a second-level integrated circuit design based on the first-level integrated circuit design. The generator when executed replaces the provider interface with the component including wiring ports of the component, including the at least one port, in the second-level integrated circuit design according to the mapping. In some implementations, an application program interface may enable a provider to communicate with the generator. The provider can utilize the API to instantiate the provider interface and determine the mapping.

20 Claims, 6 Drawing Sheets

INTEGRATED CIRCUIT GENERATOR USING A PROVIDER

CROSS-REFERENCE TO RELATED APPLICATION(S)

This application claims priority to and the benefit of U.S. Provisional Patent Application Ser. No. 63/434,806, filed Dec. 22, 2022, the entire disclosure of which is hereby incorporated by reference.

TECHNICAL FIELD

This disclosure relates generally to integrated circuit design and, more specifically, to an integrated circuit generator using a provider.

BACKGROUND

Integrated circuits may be designed and tested in a multi-step process that involves multiple specialized engineers performing a variety of different design and verification tasks on an integrated circuit design. A variety of integrated circuit design tool chains may be used by these engineers to handle different parts of the integrated circuit design workflow of using commercial electronic design automation (EDA) tools.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
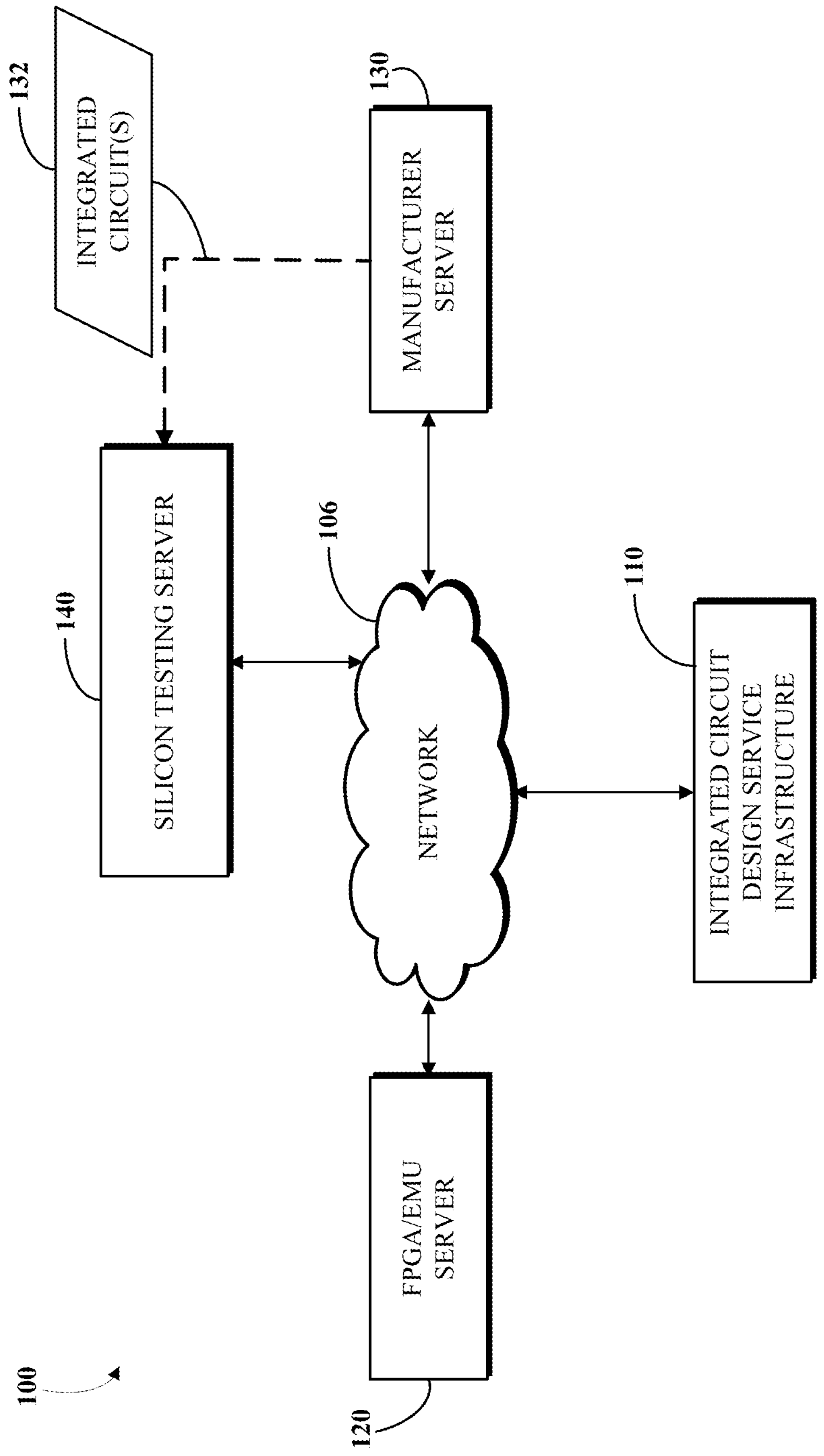
FIG. 1 is a block diagram of an example of a system for facilitating generation and manufacture of integrated circuits.

Automated generation of integrated circuit designs permits a configuration of an application specific integrated circuit (ASIC) or a system-on-a-chip (SoC) to be specified in terms of design parameters (or colloquially knobs). A system may then automate the operation of commercial EDA tools for design of the integrated circuit using the design parameters.

For example, a system may execute an integrated circuit generator (or simply a generator) to access design parameters and generate an integrated circuit design. In some implementations, the integrated circuit generator may use a hardware description language (HDL) embedded in a general-purpose programming language (e.g., Scala) that supports object-oriented programming and/or functional programming. For example, Chisel, an open source HDL embedded in Scala, a statically typed general purpose programming language that supports both object-oriented programming and functional programming, may be used to generate an integrated circuit design. The integrated circuit generator may include module descriptions that specify input(s), output(s), and/or a description(s) of a functional operation of a module (e.g., a processor core, cache, or the like, which may be represented, for example, by a Scala class).

In a process referred to as elaboration, the integrated circuit generator may execute to generate an integrated circuit design based on the design parameters. The integrated circuit design may include instances of module descriptions with connections being made. For example, the integrated circuit generator may execute constructor code to establish instances of Scala classes, with wired connections between them, as an instantiation of an integrated circuit design. In some implementations, the integrated circuit design may be encoded in an intermediate representation (IR) data structure. The IR data structure may be configured for optimization and/or translation by a compiler to produce a register-transfer level (RTL) data structure. For example, the integrated circuit generator may generate the integrated circuit design as a flexible intermediate representation for register-transfer level (FIRRTL) data structure. The FIRRTL data structure may be compiled by a FIRRTL compiler to produce an RTL data structure.

In a process referred to as compilation, the elaborated integrated circuit design (e.g., the IR data structure) may be compiled to generate an RTL data structure. For example, compiling the integrated circuit design may comprise executing one or more lowering transformations (e.g., compiler transformations that remove high-level constructs) to transform the integrated circuit design to generate the RTL data structure. The RTL data structure may encode a topology of logic associated with the instances of module descriptions implemented in the integrated circuit design (e.g., logic descriptions of the modules, such as the processor cores, caches, and the like). The RTL data structure may be compatible with EDA tools that may be used for functional verification (e.g., simulation analysis), synthesis (e.g., conversion to a gate-level description), placement and routing (e.g., physical design), and/or manufacturing of an integrated circuit (e.g., a processor, a microcontroller, an ASIC, or an SoC). In some implementations, the RTL data structure may comprise Verilog. For example, the integrated circuit design may be compiled using a FIRRTL compiler to generate Verilog.

As a result, a system may invoke an integrated circuit generator to generate an integrated circuit design. The design may include multiple blocks arranged in a hierarchy. For example, a design for an SoC may include a processor core, the processor core may include a register file, and the register file may include a hardware component such as a static random access memory (SRAM). Generating a design with a component in a block (e.g., the SRAM in the register file) may involve instantiating the component in the block. However, this may cause several challenges in the design process. For example, instantiating the component in the block may cause the component to be physically located with circuitry associated with the block in the physical design (e.g., physically locating the SRAM with the register file). This may complicate the design, such as by having multiple copies of the component in multiple blocks spread throughout the design (as opposed to having copies of the component co-located to serve the multiple blocks).

Further, instantiating the component in the block may involve connecting ports of the component in the block that are unrelated to the block. For example, instantiating an SRAM in a register file may involve connecting test ports (e.g., built-in self-testing (BIST) ports, or simply test ports) unrelated to the register file (as opposed to read and write ports that are related to the register file). This may complicate the design by having to account for routing of the unrelated ports in the block through multiple levels of hierarchy. Moreover, this may complicate parameterizing the integrated circuit generator to permit a physical location of a component to be changed without changing the code associated with the block or the generator. Thus, instantiating a component may involve wiring numerous ports through the design which may be painstaking and error prone (and enabling use of the ports may involve parameterizing the generator at every level of the hierarchy where the ports are wired through). What is needed is a system that enables a component to be logically used in a block while simplifying the design process.

Implementations of this disclosure are designed to improve the efficiency of the integrated circuit design process by enabling a first-level integrated circuit design (e.g., a language program, such as Chisel) to omit certain ports and/or wiring of ports used in a second-level integrated circuit design (e.g., an IR data structure or an RTL data structure). A software system and interface referred to as a provider may enable an integrated circuit generator to instantiate a provider interface (e.g., a logical interface of a component, such as access to the read and write ports of an SRAM) in a particular unit or block of the design (e.g., the register file). The integrated circuit generator may use the provider to thread resources through the design hierarchy to blocks that utilize the provider interface. The physical instantiation of a component can then be determined at the SoC-level (e.g., via integrated circuit generator parameters) by determining the implementation of the provider that provides the logical interface in the design (e.g., the SRAM). As a result, determination of the physical location of a component (having resources instantiated in a block) may be made at the SoC-level as opposed to the unit-level.

Further, the provider may be parameterized to enable various interfaces for requested components and to determine where in a design those interfaces are instantiated. The provider may encapsulate integrated circuit generator logic within a single, reusable application programming interface (API) that enables a unit-level determination for a component and an SoC-level determination for a physical location of the component. The SoC-level determination can also include connecting any additional interfaces the components may have (e.g., the test ports). As a result, connecting components through levels of the hierarchy may be simplified by using the provider to automatically wire any number of components across the hierarchy.

FIG. 1 is a block diagram of an example of a system 100 for generation and manufacture of integrated circuits. The system 100 includes a network 106, an integrated circuit design service infrastructure 110 (e.g., integrated circuit generator), a field programmable gate array (FPGA)/emulator server 120, and a manufacturer server 130. For example, a user may utilize a web client or a scripting API client to command the integrated circuit design service infrastructure 110 to automatically generate an integrated circuit design based on a set of design parameter values selected by the user for one or more template integrated circuit designs. In some implementations, the integrated circuit design service infrastructure 110 may be configured to include an integrated circuit generator using a provider as described in FIGS. 2-6.

The integrated circuit design service infrastructure 110 may include an RTL service module configured to generate an RTL data structure for the integrated circuit based on a design parameters data structure. For example, the RTL service module may be implemented as Scala code. For example, the RTL service module may be implemented using Chisel. For example, the RTL service module may be implemented using FIRRTL and/or a FIRRTL compiler. For example, the RTL service module may be implemented using Diplomacy. For example, the RTL service module may enable a well-designed chip to be automatically developed from a high level set of configuration settings using a mix of Diplomacy, Chisel, and FIRRTL. The RTL service module may take the design parameters data structure (e.g., a java script object notation (JSON) file) as input and output for specifying an RTL data structure (e.g., a Verilog file) for the chip.

In some implementations, the integrated circuit design service infrastructure 110 may invoke (e.g., via network communications over the network 106) testing of the resulting design that is performed by the FPGA/emulation server 120 that is running one or more FPGAs or other types of hardware or software emulators. For example, the integrated circuit design service infrastructure 110 may invoke a test using a field programmable gate array, programmed based on a field programmable gate array emulation data structure, to obtain an emulation result. The field programmable gate array may be operating on the FPGA/emulation server 120, which may be a cloud server. Test results may be returned by the FPGA/emulation server 120 to the integrated circuit design service infrastructure 110 and relayed in a useful format to the user (e.g., via a web client or a scripting API client).

The integrated circuit design service infrastructure 110 may also facilitate the manufacture of integrated circuits using the integrated circuit design in a manufacturing facility associated with the manufacturer server 130. In some implementations, a physical design specification (e.g., a graphic data system (GDS) file, such as a GDSII file) based on a physical design data structure for the integrated circuit is transmitted to the manufacturer server 130 to invoke manufacturing of the integrated circuit (e.g., using manufacturing equipment of the associated manufacturer). For example, the manufacturer server 130 may host a foundry tape-out website that is configured to receive physical design specifications (e.g., such as a GDSII file or an open artwork system interchange standard (OASIS) file) to schedule or otherwise facilitate fabrication of integrated circuits. In some implementations, the integrated circuit design service infrastructure 110 supports multi-tenancy to allow multiple integrated circuit designs (e.g., from one or more users) to share fixed costs of manufacturing (e.g., reticle/mask generation, and/or shuttles wafer tests). For example, the integrated circuit design service infrastructure 110 may use a fixed package (e.g., a quasi-standardized packaging) that is defined to reduce fixed costs and facilitate sharing of reticle/mask, wafer test, and other fixed manufacturing costs. For example, the physical design specification may include one or more physical designs from one or more respective physical design data structures in order to facilitate multi-tenancy manufacturing.

In response to the transmission of the physical design specification, the manufacturer associated with the manufacturer server 130 may fabricate and/or test integrated circuits based on the integrated circuit design. For example, the associated manufacturer (e.g., a foundry) may perform optical proximity correction (OPC) and similar post-tape-out/pre-production processing, fabricate the integrated circuit(s) 132, update the integrated circuit design service infrastructure 110 (e.g., via communications with a controller or a web application server) periodically or asynchronously on the status of the manufacturing process, perform appropriate testing (e.g., wafer testing), and send to a packaging house for packaging. A packaging house may receive the finished wafers or dice from the manufacturer and test materials and update the integrated circuit design service infrastructure 110 on the status of the packaging and delivery process periodically or asynchronously. In some implementations, status updates may be relayed to the user when the user checks in using the web interface, and/or the controller might email the user that updates are available.

In some implementations, the resulting integrated circuit (s) 132 (e.g., physical chips) are delivered (e.g., via mail) to a silicon testing service provider associated with a silicon testing server 140. In some implementations, the resulting integrated circuit(s) 132 (e.g., physical chips) are installed in a system controlled by the silicon testing server 140 (e.g., a cloud server), making them quickly accessible to be run and tested remotely using network communications to control the operation of the integrated circuit(s) 132. For example, a login to the silicon testing server 140 controlling a manufactured integrated circuit(s) 132 may be sent to the integrated circuit design service infrastructure 110 and relayed to a user (e.g., via a web client). For example, the integrated circuit design service infrastructure 110 may be used to control testing of one or more integrated circuit(s) 132.

Figure 2:
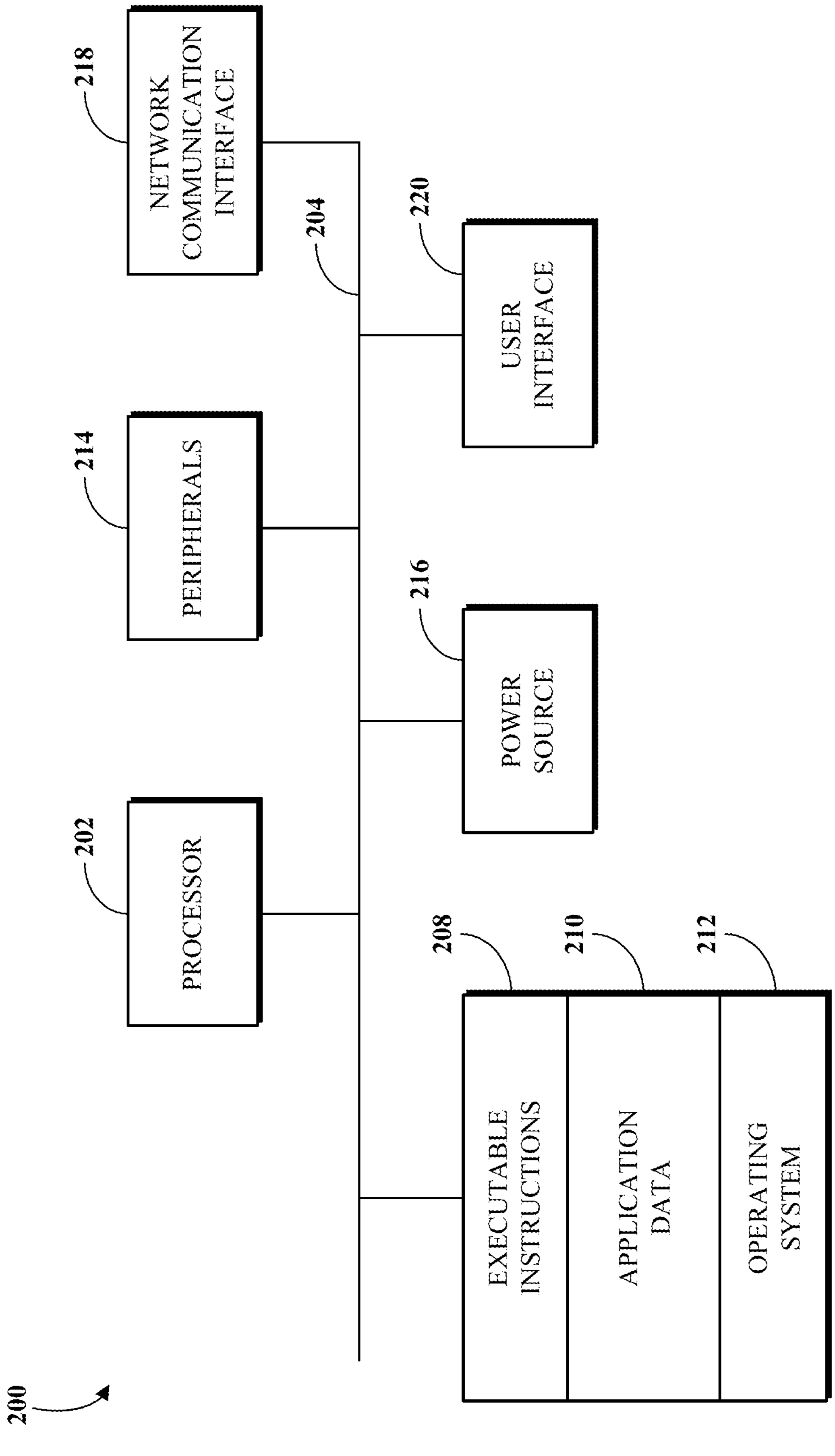
FIG. 2 is a block diagram of an example of a system for facilitating generation of integrated circuits.

FIG. 2 is a block diagram of an example of a system 200 for facilitating generation of integrated circuits, for facilitating generation of a circuit representation for an integrated circuit, and/or for programming or manufacturing an integrated circuit. The system 200 is an example of an internal configuration of a computing device that may be used to implement the integrated circuit design service infrastructure 110 of FIG. 1. The system 200 can include components or units, such as a processor 202, a bus 204, a memory 206, peripherals 214, a power source 216, a network communication interface 218, a user interface 220, other suitable components, or a combination thereof.

The processor 202 can be a central processing unit (CPU), such as a microprocessor, and can include single or multiple processors having single or multiple processing cores. Alternatively, the processor 202 can include another type of device, or multiple devices, now existing or hereafter developed, capable of manipulating or processing information. For example, the processor 202 can include multiple processors interconnected in any manner, including hardwired or networked, including wirelessly networked. In some implementations, the operations of the processor 202 can be distributed across multiple physical devices or units that can be coupled directly or across a local area or other suitable type of network. In some implementations, the processor 202 can include a cache, or cache memory, for local storage of operating data or instructions.

The memory 206 can include volatile memory, non-volatile memory, or a combination thereof. For example, the memory 206 can include volatile memory, such as one or more dynamic random access memory (DRAM) modules such as double data rate (DDR) synchronous DRAM (SDRAM), and non-volatile memory, such as a disk drive, a solid-state drive, flash memory, Phase-Change Memory (PCM), or any form of non-volatile memory capable of persistent electronic information storage, such as in the absence of an active power supply. The memory 206 can include another type of device, or multiple devices, now existing or hereafter developed, capable of storing data or instructions for processing by the processor 202. The processor 202 can access or manipulate data in the memory 206 via the bus 204. Although shown as a single block in FIG. 2, the memory 206 can be implemented as multiple units. For example, a system 200 can include volatile memory, such as random access memory (RAM), and persistent memory, such as a hard drive or other storage.

The memory 206 can include executable instructions 208, data, such as application data 210, an operating system 212, or a combination thereof, for immediate access by the processor 202. The executable instructions 208 can include, for example, one or more application programs, which can be loaded or copied, in whole or in part, from non-volatile memory to volatile memory to be executed by the processor 202. The executable instructions 208 can be organized into programmable modules or algorithms, functional programs, codes, code segments, or combinations thereof to perform various functions described herein. For example, the executable instructions 208 can include instructions executable by the processor 202 to cause the system 200 to automatically, in response to a command, generate an integrated circuit design and associated test results based on a design parameters data structure. The application data 210 can include, for example, user files, database catalogs or dictionaries, configuration information or functional programs, such as a web browser, a web server, a database server, or a combination thereof. The operating system 212 can be, for example, Microsoft Windows®, macOS®, or Linux®; an operating system for a small device, such as a smartphone or tablet device; or an operating system for a large device, such as a mainframe computer. The memory 206 can comprise one or more devices and can utilize one or more types of storage, such as solid-state or magnetic storage.

The peripherals 214 can be coupled to the processor 202 via the bus 204. The peripherals 214 can be sensors or detectors, or devices containing any number of sensors or detectors, which can monitor the system 200 itself or the environment around the system 200. For example, a system 200 can contain a temperature sensor for measuring temperatures of components of the system 200, such as the processor 202. Other sensors or detectors can be used with the system 200, as can be contemplated. In some implementations, the power source 216 can be a battery, and the system 200 can operate independently of an external power distribution system. Any of the components of the system 200, such as the peripherals 214 or the power source 216, can communicate with the processor 202 via the bus 204.

The network communication interface 218 can also be coupled to the processor 202 via the bus 204. In some implementations, the network communication interface 218 can comprise one or more transceivers. The network communication interface 218 can, for example, provide a connection or link to a network, such as the network 106 shown in FIG. 1, via a network interface, which can be a wired network interface, such as Ethernet, or a wireless network interface. For example, the system 200 can communicate with other devices via the network communication interface 218 and the network interface using one or more network protocols, such as Ethernet, transmission control protocol (TCP), Internet protocol (IP), power line communication (PLC), Wi-Fi, infrared, general packet radio service (GPRS), global system for mobile communications (GSM), code division multiple access (CDMA), or other suitable protocols.

A user interface 220 can include a display; a positional input device, such as a mouse, touchpad, touchscreen, or the like; a keyboard; or other suitable human or machine interface devices. The user interface 220 can be coupled to the processor 202 via the bus 204. Other interface devices that permit a user to program or otherwise use the system 200 can be provided in addition to or as an alternative to a display. In some implementations, the user interface 220 can include a display, which can be a liquid crystal display (LCD), a cathode-ray tube (CRT), a light emitting diode (LED) display (e.g., an organic light emitting diode (OLED) display), or other suitable display. In some implementations, a client or server can omit the peripherals 214. The operations of the processor 202 can be distributed across multiple clients or servers, which can be coupled directly or across a local area or other suitable type of network. The memory 206 can be distributed across multiple clients or servers, such as network-based memory or memory in multiple clients or servers performing the operations of clients or servers. Although depicted here as a single bus, the bus 204 can be composed of multiple buses, which can be connected to one another through various bridges, controllers, or adapters.

A non-transitory computer readable medium may store a circuit representation that, when processed by a computer, is used to program or manufacture an integrated circuit. For example, the circuit representation may describe the integrated circuit specified using a computer readable syntax. The computer readable syntax may specify the structure or function of the integrated circuit or a combination thereof. In some implementations, the circuit representation may take the form of a hardware description language (HDL) program, an RTL data structure, a FIRRTL data structure, a Graphic Design System II (GDSII) data structure, a netlist, or a combination thereof. In some implementations, the integrated circuit may take the form of an FPGA, an ASIC, an SoC, or some combination thereof. A computer may process the circuit representation in order to program or manufacture an integrated circuit, which may include programming an FPGA or manufacturing an ASIC or an SoC. In some implementations, the circuit representation may comprise a file that, when processed by a computer, may generate a new description of the integrated circuit. For example, the circuit representation could be written in a language such as Chisel, an HDL embedded in Scala, a statically typed general purpose programming language that supports both object-oriented programming and functional programming.

In an example, a circuit representation may be a Chisel language program which may be executed by the computer to produce a circuit representation expressed in a FIRRTL data structure. In some implementations, a design flow of processing steps may be utilized to process the circuit representation into one or more intermediate circuit representations followed by a final circuit representation which is then used to program or manufacture an integrated circuit. In one example, a circuit representation in the form of a Chisel program may be stored on a non-transitory computer readable medium and may be processed by a computer to produce a FIRRTL circuit representation. The FIRRTL circuit representation may be processed by a computer to produce an RTL circuit representation. The RTL circuit representation may be processed by the computer to produce a netlist circuit representation. The netlist circuit representation may be processed by the computer to produce a GDSII circuit representation. The GDSII circuit representation may be processed by the computer to produce the integrated circuit.

In another example, a circuit representation in the form of Verilog or VHDL may be stored on a non-transitory computer readable medium and may be processed by a computer to produce an RTL circuit representation. The RTL circuit representation may be processed by the computer to produce a netlist circuit representation. The netlist circuit representation may be processed by the computer to produce a GDSII circuit representation. The GDSII circuit representation may be processed by the computer to produce the integrated circuit. The foregoing steps may be executed by the same computer, different computers, or some combination thereof, depending on the implementation.

Figure 3:
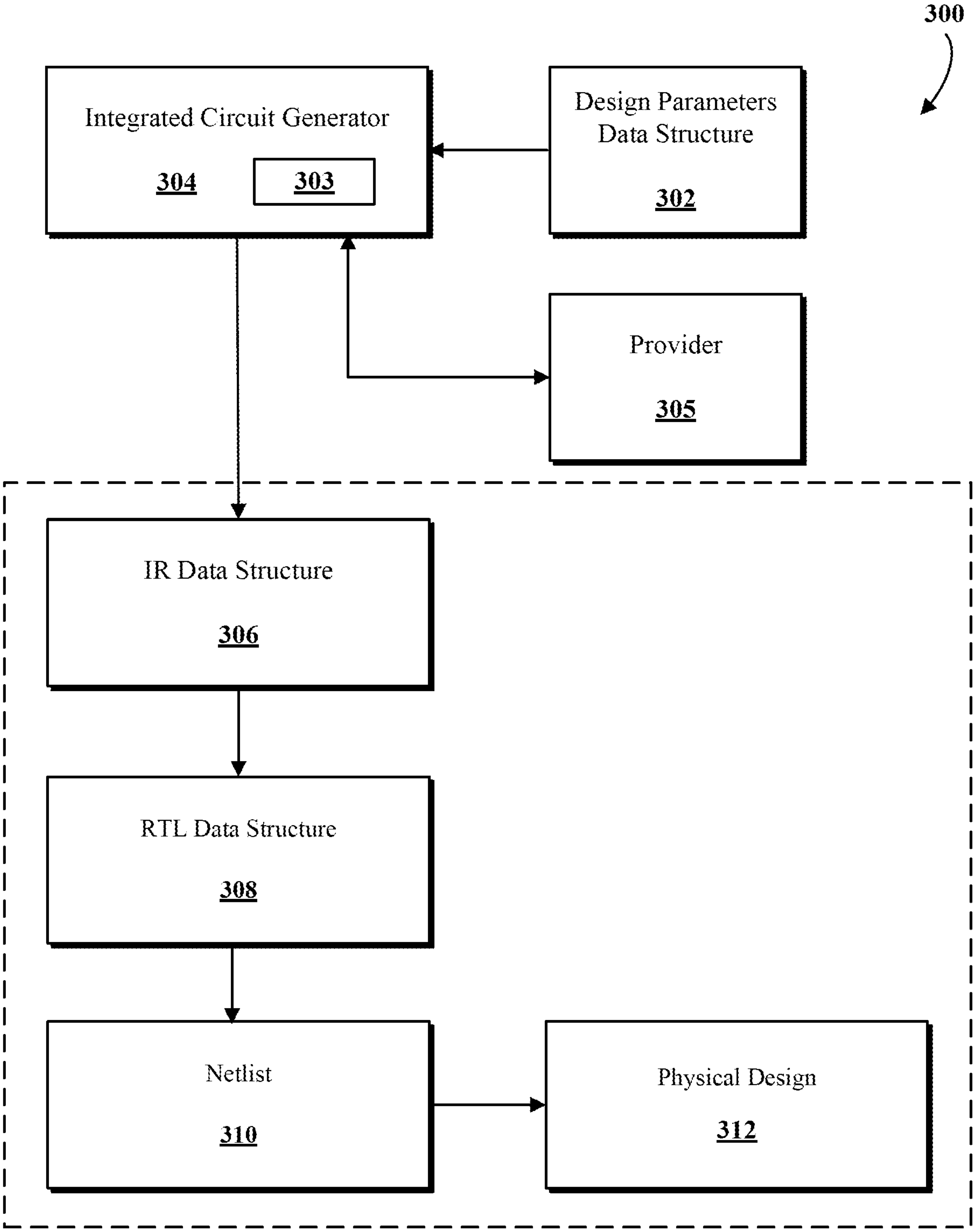
FIG. 3 is a block diagram of an example of a system including an integrated circuit generator using a provider.

FIG. 3 is a block diagram of an example of a system 300 including an integrated circuit generator 304 using a provider 305. For example, the integrated circuit design service infrastructure 110 of FIG. 1 may implement the system 300. The system 300 may include a design parameters data structure 302, the integrated circuit generator 304, and the provider 305. The design parameters data structure 302 (e.g., a design specification, such as a JSON file) may specify parameters for the integrated circuit generator 304. For example, the design parameters data structure 302 may specify parameters for an integrated circuit design that could be an SoC.

The integrated circuit generator 304 may utilize the provider 305 to generate an IR data structure 306, corresponding to the integrated circuit design. The integrated circuit generator 304 may generate the IR data structure 306 based on the parameters from the design parameters data structure 302. The integrated circuit generator 304 may use a language program 303, such as an HDL embedded in a general-purpose programming language (e.g., Scala) that supports object-oriented programming and/or functional programming. For example, the integrated circuit generator 304 may use Chisel, an open source HDL embedded in Scala, a statically typed general purpose programming language that supports both object-oriented programming and functional programming. The language program 303 (e.g., the Chisel program) may be a first-level integrated circuit design. The integrated circuit generator 304 may use the language program 303 to generate the IR data structure 306. For example, the integrated circuit generator 304 may execute or run the language program 303 to generate the IR data structure 306. The IR data structure 306 may be an encoding of the integrated circuit design in an intermediate representation (e.g., a FIRRTL data structure), including instances of logic descriptions (e.g., logic associated with processor cores, caches, and other structures) with connections between them. In some implementations, the IR data structure 306 may be a second-level integrated circuit design.

A compiler may be invoked to convert the IR data structure 306 to an RTL data structure 308 corresponding to the integrated circuit design, such as System Verilog. For example, the compiler could be a FIRRTL compiler. The RTL data structure 308 may encode a topology of logic associated with the instances of logic descriptions implemented in the integrated circuit design (e.g., logic associated with the modules, such as the processor cores, caches, and other structures). In some implementations, the integrated circuit generator 304 may generate the RTL data structure 308 directly, without generating the IR data structure 306.

Thus, in some cases, the RTL data structure 308 may be the second-level integrated circuit design.

A synthesis tool may be invoked to convert the RTL data structure 308 to a netlist 310. The netlist 310 may indicate a description of circuitry and associated connectivity of the integrated circuit design (e.g., a plurality of wires, transistors, and/or gates and their connections). Additional EDA tools may be further invoked with respect to the integrated circuit design, such as a place and route tool for generating a physical design 312 of the integrated circuit design based on the netlist 310, and a functional verification tool for simulation analysis of the physical design 312. In some cases, the netlist 310 or the physical design 312 may be the second-level integrated circuit design.

To improve the design process, the integrated circuit generator 304 and/or the provider 305 can configure an API to enable the provider 305 to communicate with the integrated circuit generator 304. The first-level integrated circuit design may be configured by the integrated circuit generator 304 requesting from the provider 305 a provider interface in a block of the first-level integrated circuit design. The integrated circuit generator 304 can request the provider interface via the API. For example, the provider interface could be the logical portion of an SRAM interface associated with an SRAM component, or the logical portion of a clock interface associated with a clock gate, or the logical portion of a strap interface associated with a strap pin. The logical portion may include access to ports associated with a function of the component, without including other ports of the component. For example, the logical portion of the SRAM interface may include access to the read and write ports associated with the SRAM without including a test port of the SRAM. In another example, the logical portion of the clock interface may include access to the clock port associated with the clock gate without including a test port of the clock gate. The integrated circuit generator 304 may receive design parameters, via the design parameters data structure 302, that specify the component in the block, and the integrated circuit generator 304 may request from the provider 305 the provider interface based on the specified component.

The provider 305 can provide the provider interface in the block via the API. The block may be a level of a hierarchy in the first-level integrated circuit design. For example, the block could be a register file, dispatch unit, execution unit, cache, queue, data path, and/or other logic implemented by a processor core that is implemented by an SoC. For example, when the component in the block is an SRAM in a register file, the provider 305 can instantiate the logical portion of the SRAM interface in the register file. The provider 305 can utilize the API to instantiate the provider interface in the block in the first-level integrated circuit design. The provider 305 can also utilize the API to determine the mapping to the provider interface in the block. In some cases, the provider 305 can determine the mapping through multiple levels of hierarchy (e.g., from the register file, through the processor core that implements the register file, to the SoC). The integrated circuit generator 304 can utilize the provider interface as a placeholder for a generic component in the block without wiring one or more port of the component, and instead mapping the providing interface. For example, the integrated circuit generator 304 can utilize the provider interface as a placeholder for a generic SRAM, providing access to read and write ports in the block, without wiring test ports of the SRAM, instead mapping the providing interface for the generic SRAM. This may enable a simplification of the design process by avoiding the wiring of ports that may be burdensome, such as the test ports, and may enable flexibility in the design process by enabling selection of the component in connection with the second-level integrated circuit design.

The integrated circuit generator 304 can be invoked to generate the second-level integrated circuit design (e.g., the IR data structure 306, the RTL data structure 308, the netlist 310, or the physical design 312) based on the first-level integrated circuit design. For example, the integrated circuit design service infrastructure 110 of FIG. 1 may invoke the integrated circuit generator 304, using the language program 303, to generate the second-level integrated circuit design. The integrated circuit generator 304, when executed, replaces the provider interface with the component, including wiring ports of the component, including the at least one port that was not previously wired, in the second-level integrated circuit design according to the mapping. For example, the integrated circuit generator 304 when executed can replace the SRAM interface with the SRAM component that is implemented, including wiring the read and write ports of the SRAM, and the test port that was not previously wired, in the IR data structure 306, the RTL data structure 308, the netlist 310, or the physical design 312 according to the mapping. The integrated circuit generator 304 can replace the provider interface with a specific component that may be specified in the design parameters data structure 302 (e.g., a component that may have test ports configured for a specific technology process).

In some implementations, the provider 305 may comprise a software interface and mechanism that enables the instantiation of the provider interface in the first-level integrated circuit design (e.g., a functional or logical interface for a particular component, utilized by the integrated circuit generator 304). For example, the provider 305 may provide an object for an SRAM interface associated with an SRAM, or an object for a clock interface associated with a clock gate, or an object for a strap interface associated with a strap pin. The provider 305 can provide any number of provider interfaces for a component in the first-level integrated circuit design in any number of blocks. The provider 305 can thread the provider interface through the levels of hierarchy implemented by the first-level integrated circuit design to generate a mapping. The integrated circuit generator 304 can request one or more provider interfaces corresponding to one or more components (e.g., the read and write ports of an SRAM) from the provider 305. The determination of where to physically instantiate the requested components can then be made in connection with the second-level integrated circuit design (e.g., the IR data structure 306, the RTL data structure 308, the netlist 310, or the physical design 312). For example, the determination of where to physically instantiate the requested components can be made at the SoC-level when determining which implementation of a generic provider interface (corresponding to a generic component associated with the first-level integrated circuit design) is actually used in the second-level integrated circuit design. As a result, wiring in the first-level integrated circuit design (e.g., the unit-level) may be simplified by simply threading the provider interface through (as opposed to wiring numerous ports, such as test ports), while enabling the second-level integrated circuit design (e.g., the SoC-level) to control where components that are requested via the provider 305 are physically located.

Further, the provider 305 may be parameterized to allow additional provider interfaces for requested components. The provider 305 may also determine where in the first-level integrated circuit design those provider interfaces are connected or threaded. The provider 305 may encapsulate logic associated with the integrated circuit generator 304 within a single, reusable API that enables the integrated circuit generator 304 or the first-level integrated circuit design (e.g., the unit-level) to request a component, and enables the integrated circuit generator 304 or the second-level integrated circuit design (e.g., the SoC-level) to determine a physical location for the component and provide its implementation. For example, generation of the second-level integrated circuit design may include resolving provider interfaces of the components based on particular design parameterization. Wiring any number of those components across the hierarchy may be resolved automatically by using the mapping from the provider 305.

Figure 4:
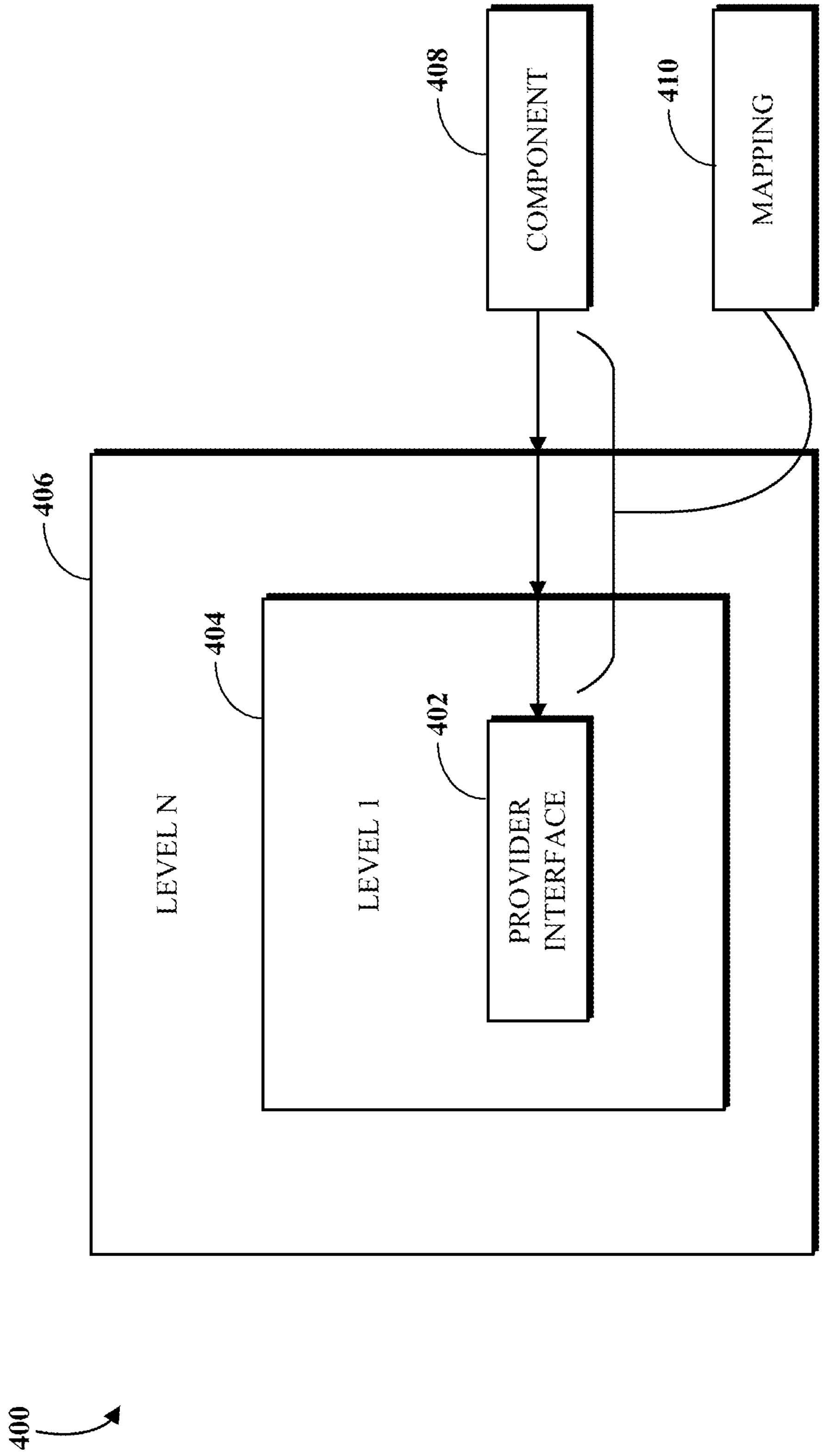
FIG. 4 is a block diagram of an example of an integrated circuit design including multiple levels of the hierarchy.

FIG. 4 is a block diagram of an example of a hierarchy 400 including a provider interface 402. The hierarchy 400 may be associated with the first-level integrated circuit design of FIG. 3 (e.g., the language program 303, used by the integrated circuit generator 304). The provider interface 402 could be instantiated by the provider 305. The provider interface 402 could be instantiated in a block 404 that is a lower level of the hierarchy 400 (e.g., level 1). The block 404 may be a sub-level of one or more higher levels in the hierarchy 400, such as a higher block 406 (e.g., level N, where N is an integer greater than 1). For example, the block 404 could be a register file, and the higher block 406 could be a level in the hierarchy that instantiates the register file, such as a first processor core implemented by an SoC. In other examples, the block 404 could be a dispatch unit, execution unit, cache, queue, data path, or other logic. The provider interface 402 could provide a logical interface for a component 408 without wiring one or more ports of the component 408. For example, the component 408 could be an SRAM, a clock gate, or a strap pin. The provider interface 402 could provide a logical interface for the SRAM, the clock gate, or the strap pin without wiring test ports of the SRAM, the clock gate, or the strap pin through the hierarchy. For example, the provider interface 402 could provide a logical interface for the SRAM (e.g., access to read and write ports) without wiring the test port of the SRAM. The provider 305 can thread the provider interface 402 through the levels of the hierarchy 400 (e.g., the block 404 and the level 406) by a mapping 410 maintained by the provider 305.

Thus, the provider interface 402 can be requested by the integrated circuit generator 304 when a logical interface corresponding to the component 408 is utilized in a block of the first-level integrated circuit design (e.g., the read and write ports of an SRAM in the register file). This can be performed without wiring one or more ports of the component, but rather threading a single provider interface (e.g., the provider interface 402). As a result, instead of wiring through many ports of the component 408 (e.g., including the test ports, which may be cumbersome), the provider 305 can simply map through the provider interface 402 through the levels of the hierarchy (e.g., to the block 404, through the higher block 406). This may simplify the design process, such as by not manually threading N number of ports times M number of blocks through the hierarchy. The provider 305 can instantiate the provider interface 402 (e.g., access to the read and write ports relating to storage, which is the functional or logical part of the SRAM, as opposed to the test ports relating to BIST, which is not the functional or logical part of the SRAM). Thus, the location of the provider interface 402 and handling of the additional interfaces or ports (e.g., the test ports) may be abstracted away from the first-level integrated circuit design (e.g., hidden in the design).

For example, the provider 305 may enable a single provider object (e.g., the provider interface 402) to be passed through for an entire block, agent, or widget (e.g., a register file). The provider 305 may service one or more requests for provider interfaces (e.g., multiple SRAM interfaces), and the provider 305 can keep track of the requests and corresponding instantiations. This may enable instantiations of the provider interface 402 (e.g., the read and write interfaces that are utilized) in the integrated circuit design 306 without bringing the entire component (e.g., test interfaces that are not utilized). The provider 305 can provide one or more of the provider interface 402, each of which correspond to a single component of the type it provides (e.g., the component 408). For example, the provider 305 could be a memory provider that provides one or more memory logical interfaces (e.g., the read and write ports of an SRAM). Other interfaces of the memory (e.g., the test interface) can be accessed at a higher level of the design (e.g., the second-level integrated circuit design) after the functional instantiations. For example, after the functional instantiations, the provider 305 may be queried to provide the test interfaces corresponding to the M number of components that were instantiated.

In some implementations, the provider 305 may automatically connect the provider interface 402 of a component to circuitry that checks for correctness in a lockstep environment. For example, the provider interface 402 may be used to implement lockstep, such as split-lock and/or dual-core lockstep (DCLS). Split-lock may refer to a partially dynamic lockstep solution involving a circuitry (e.g., a processor core 0) as a replicated functional block (e.g., a processor core 1). With split-lock, an integrated circuit could operate in a split mode at times (where processor core 0 and processor core 1 are not in lockstep, but rather are operating logically as two cores) and in a lock mode at other times (where processor core 0 and processor core 1 are in lockstep, operating logically as one core). DCLS may refer to a static lockstep solution involving a circuitry (e.g., a processor core 0) as a replicated functional block, but with large memories (e.g., a private cache, such as L1/L2 cache, associated with processor core 1) being excluded from the lockstep domain. Excluding large memories from the lockstep domain may enable optimizing power, performance, and area (taking advantage of large memories already being protected, such as via error checking and correction (ECC)). For example, the provider interface 402 could correspond to a memory (e.g., the L1/L2 cache) connected in lockstep. The location of the provider interface 402 and connections of the additional interfaces or ports (e.g., the test ports) may be abstracted away from the first-level integrated circuit design that implements the lockstep.

In some cases, the configuration of a test port for a component may be a function of the specific component that is used in the design. For example, the configuration of a test port for an SRAM may be a function of the specific SRAM macro that is used. The specific component and its test function may be tied to a particular manufacturing process (e.g., an 8 nm technology process, or a 5 nm technology process). This may result in logically equivalent components having differently configured test ports (e.g., a first SRAM having a first configured test port that targets a first technology process, and a second SRAM having a second configured test port targeting a second technology process, despite the first SRAM and the second SRAM being logically equivalent as a generic component providing read and write ports). The provider interface 402 may enable implementation of the logical portion of the component (e.g., access to the read and write ports) in the first-level integrated circuit design without regard to the differences in the test ports (e.g., without wiring the test ports). This may enable using a single provider interface 402 for a generic component in the first-level integrated circuit design, followed by selection of a specific component in the second-level integrated circuit design.

Figure 5:
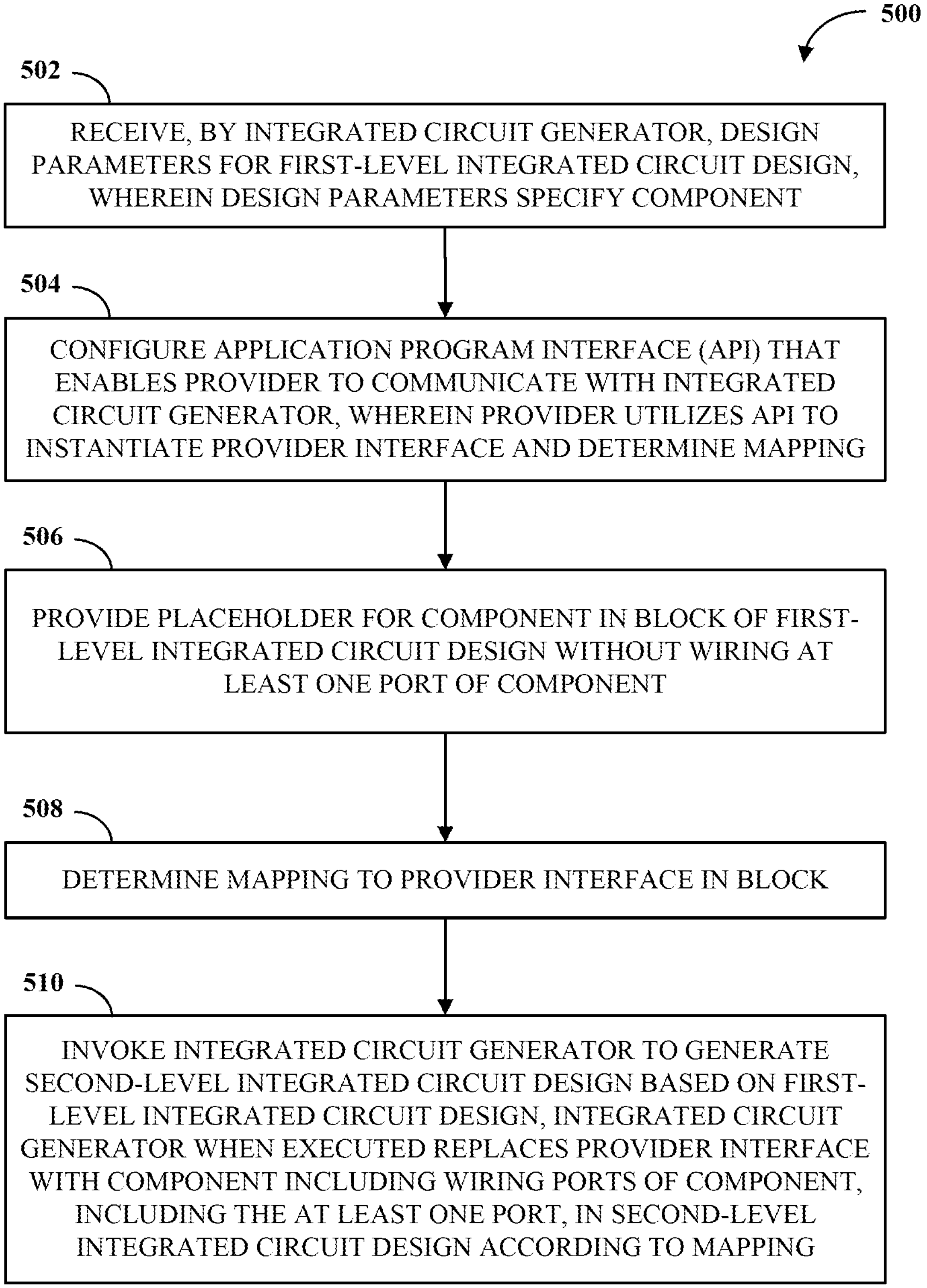
FIG. 5 is a flow chart of an example of a process for an integrated circuit generator using a provider.

To further describe some implementations in greater detail, reference is next made to examples of methods which may be performed by using a provider. FIG. 5 is a flow chart of an example of a process 500 for an integrated circuit generator using a provider. The process 500 can be performed, for example, using the systems, hardware, and software described with respect to FIGS. 1-4. The steps, or operations, of the process 500 or another technique, method, process, or algorithm described in connection with the implementations disclosed herein can be implemented directly in hardware, firmware, software executed by hardware, circuitry, or a combination thereof. Further, for simplicity of explanation, although the figures and descriptions herein may include sequences or series of steps or stages, elements of the methods and claims disclosed herein may occur in various orders or concurrently and need not include all of the steps or stages. Additionally, elements of the methods and claims disclosed herein may occur with other elements not explicitly presented and described herein. Furthermore, not all elements of the methods and claims described herein may be required in accordance with this disclosure. Although aspects, features, and elements are described and claimed herein in particular combinations, each aspect, feature, or element may be used and claimed independently or in various combinations with or without other aspects, features, and elements.

At 502, a system may include an integrated circuit generator and a provider. For example, the system may be implemented by the integrated circuit design service infrastructure 110 of FIG. 1. In another example, the system may include the integrated circuit generator 304 and the provider 305 of FIG. 3. The integrated circuit generator may receive design parameters for a first-level integrated circuit design. For example, the integrated circuit generator may receive design parameters, specified in the design parameters data structure 302 of FIG. 3, to configure a first-level integrated circuit design corresponding to a Chisel language program (e.g., the language program 303). The design parameters may specify, among other things, a component in a block. For example, the component could be an SRAM, and the block could be a register file, which may be implemented by a processor core that is implemented by an SoC.

At 504, the system may configure an API that enables the provider to communicate with the integrated circuit generator. For example, the integrated circuit generator and/or the provider can configure the API to enable the provider to communicate with the integrated circuit generator. The API may encapsulate integrated circuit generator logic that enables a unit-level determination for a component and an SoC-level determination for a physical location of the component.

At 506, the system may provide a placeholder for the component in the block of the first-level integrated circuit design without wiring at least one port of the component (e.g., without wiring a test port). For example, the integrated circuit generator 304 of FIG. 3 may utilize the API to request the provider interface 402 in the block 404 of a first-level integrated circuit design of FIG. 4. The integrated circuit generator can utilize the provider interface as a placeholder for a generic component in the block without wiring one or more individual ports of the component (e.g., without wiring the test port). In another example, the provider 305 of FIG. 3 may utilize the API to instantiate the provider interface 402 in the block 404 of the first-level integrated circuit design of FIG. 4.

At 508, the system may determine a mapping to the provider interface in the block. For example, the provider may utilize the API to determine the mapping 410 to the provider interface 402 of FIG. 4 in the block of the first-level integrated circuit design. For example, the provider may generate the mapping when threading the provider interface through levels of hierarchy to blocks that utilize the provider interface. The mapping may be maintained by the provider.

At 510, the system may invoke the integrated circuit generator to generate a second-level integrated circuit design based on the first-level integrated circuit design. The integrated circuit generator when executed replaces the provider interface with the component including wiring ports of the component, including the at least one port, in the second-level integrated circuit design according to the mapping. For example, the integrated circuit design service infrastructure 110 of FIG. 1 may invoke the integrated circuit generator 304 of FIG. 3 to generate the second-level integrated circuit design, which could be the IR data structure 306, the RTL data structure 308, the netlist 310, or the physical design 312. The integrated circuit generator when executed can replace the provider interface with a specific component that may be specified in the design parameters data structure. Replacing the provider interface with the component may include wiring ports of the component, including the at least one port, in the second-level integrated circuit design according to the mapping. For example, replacing the provider interface with the component may include wiring read and write port ports of the component, as well as the test port, in the second-level integrated circuit design.

Figure 6:
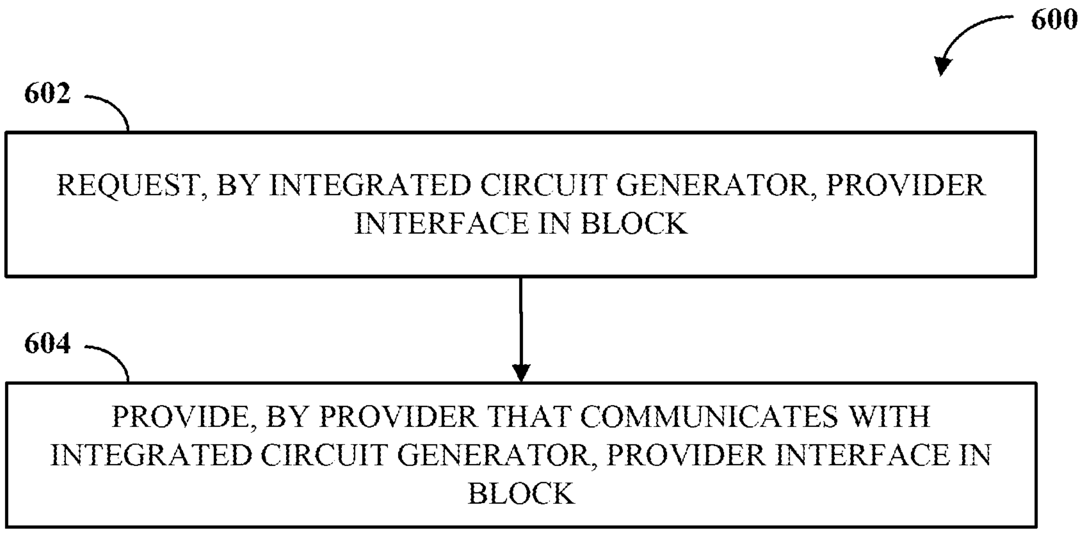
FIG. 6 is a flow chart of an example of a process for an integrated circuit generator requesting a provider interface.

FIG. 6 is a flow chart of an example of a process 600 for an integrated circuit generator requesting a provider interface. The process 600 can be performed, for example, using the systems, hardware, and software described with respect to FIGS. 1-4. The steps, or operations, of the process 600 or another technique, method, process, or algorithm described in connection with the implementations disclosed herein can be implemented directly in hardware, firmware, software executed by hardware, circuitry, or a combination thereof. Further, for simplicity of explanation, although the figures and descriptions herein may include sequences or series of steps or stages, elements of the methods and claims disclosed herein may occur in various orders or concurrently and need not include all of the steps or stages. Additionally, elements of the methods and claims disclosed herein may occur with other elements not explicitly presented and described herein. Furthermore, not all elements of the methods and claims described herein may be required in accordance with this disclosure. Although aspects, features, and elements are described and claimed herein in particular combinations, each aspect, feature, or element may be used and claimed independently or in various combinations with or without other aspects, features, and elements.

At 602, a system may include an integrated circuit generator and a provider. For example, the system may be implemented by the integrated circuit design service infrastructure 110 of FIG. 1. In another example, the system may include the integrated circuit generator 304 and the provider 305 of FIG. 3. The integrated circuit generator may request a provider interface in a block of a first-level integrated circuit design. For example, the integrated circuit generator may request the provider interface 402 in the block 404 of FIG. 4. The provider interface may enable implementation of a logical portion of a component (e.g., access to the read and write ports of an SRAM) in the first-level integrated circuit design without wiring other ports of the component (e.g., test ports of the SRAM). The integrated circuit generator may request a plurality of provider interfaces in a plurality of blocks (e.g., register files, dispatch units, execution units, caches, queues, data paths, and/or other logic). The integrated circuit generator may request a plurality of provider interfaces for a plurality of components (e.g., an SRAM, a clock gate, a strap pin).

At 604, the provider may provide the provider interface in the block of the first-level integrated circuit design. For example, the provider 305 of FIG. 3 may provide the provider interface 402 in the block 404 of FIG. 4. The provider may generate a mapping when threading the provider interface through levels of hierarchy to blocks that utilize the provider interface. The mapping may be maintained by the provider. The provider may provide a plurality of provider interfaces in a plurality of blocks (e.g., register files, dispatch units, execution units, caches, queues, data paths, and/or other logic). The provider may provide a plurality of provider interfaces for a plurality of components (e.g., an SRAM, a clock gate, a strap pin).

Some implementations may include a method comprising providing a placeholder for a component in a block of a first-level integrated circuit design without wiring at least one port of the component; determining a mapping to a provider interface in the block; and invoking an integrated circuit generator to generate a second-level integrated circuit design based on the first-level integrated circuit design, the integrated circuit generator when executed replaces the provider interface with the component including wiring ports of the component, including the at least one port, in the second-level integrated circuit design according to the mapping. In some implementations, the method may include configuring an API that enables a provider to communicate with the integrated circuit generator, wherein the provider utilizes the API to instantiate the provider interface and determine the mapping. In some implementations, the method may include requesting, by the integrated circuit generator, the provider interface in the block; and providing, by a provider that communicates with the integrated circuit generator, the provider interface in the block. In some implementations, the method may include receiving, by the integrated circuit generator, design parameters for the first-level integrated circuit design, wherein the design parameters specify the component. In some implementations, the first-level integrated circuit design corresponds to a language program used by the integrated circuit generator, and the second-level integrated circuit design corresponds to an IR data structure or an RTL data structure. In some implementations, the block is a level of a hierarchy, and the mapping to the provider interface is through multiple levels of the hierarchy. In some implementations, the component includes a first set of one or more ports and a second set of one or more ports, and the provider interface is instantiated in the block to provide access to the first set of one or more ports without wiring the second set of one or more ports. In some implementations, the component is an SRAM having read and write ports and a test port, and the provider interface is instantiated in the block to provide access to the read and write ports without wiring the test port. In some implementations, the provider interface provides the placeholder for a generic component, and the integrated circuit generator when executed replaces the provider interface with a specific component.

Some implementations may include an apparatus, comprising a memory; and a processor configured to execute instructions stored in the memory to determine a mapping to a provider interface in a block of a first-level integrated circuit design, the provider interface providing a placeholder for a component in the block without wiring at least one port of the component; and invoke an integrated circuit generator to generate a second-level integrated circuit design based on the first-level integrated circuit design, the integrated circuit generator when executed replaces the provider interface with the component including wiring ports of the component, including the at least one port, in the second-level integrated circuit design according to the mapping. In some implementations, the processor is further configured to execute instructions stored in the memory to configure an API that enables a provider to communicate with the integrated circuit generator, wherein the provider utilizes the API to instantiate the provider interface and determine the mapping. In some implementations, the processor is further configured to execute instructions stored in the memory to request, by the integrated circuit generator, the provider interface in the block; and provide, by a provider that communicates with the integrated circuit generator, the provider interface in the block. In some implementations, the processor is further configured to execute instructions stored in the memory to receive, by the integrated circuit generator, design parameters that specify the component as corresponding to a particular technology process. In some implementations, the second-level integrated circuit design corresponds to a netlist or a physical design. In some implementations, the block is a register file implemented by a processor core that is implemented by an SoC, and the mapping to the provider interface is through processor core to the register file.

Some implementations may include a non-transitory computer readable medium storing instructions operable to cause one or more processors to perform operations comprising determining a mapping to a provider interface in a block of a first-level integrated circuit design, the provider interface providing a placeholder for a component in the block without wiring at least one port of the component; and invoking an integrated circuit generator to generate a second-level integrated circuit design based on the first-level integrated circuit design, the integrated circuit generator when executed replaces the provider interface with the component including wiring ports of the component, including the at least one port, in the second-level integrated circuit design according to the mapping. In some implementations, the operations further comprise configuring an API that encapsulates logic to enable a provider to communicate with the integrated circuit generator, wherein the integrated circuit generator utilizes the API to request the provider interface from the provider. In some implementations, the operations further comprise requesting, by the integrated circuit generator, the provider interface in the block; and providing, by a provider that communicates with the integrated circuit generator, the provider interface in the block. In some implementations, the operations further comprise receiving, by the integrated circuit generator, design parameters for the first-level integrated circuit design, wherein the design parameters specify the component. In some implementations, the component is a clock gate or a strap pin.

As used herein, the term “circuitry” refers to an arrangement of electronic components (e.g., transistors, resistors, capacitors, and/or inductors) that is structured to implement one or more functions. For example, a circuit may include one or more transistors interconnected to form logic gates that collectively implement a logical function. While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. A method comprising:

providing a placeholder for a component in a block of a first-level integrated circuit design without wiring at least one port of the component, the at least one port comprising a test port;

determining a mapping to a provider interface in the block; and invoking an integrated circuit generator to generate a second-level integrated circuit design based on the first-level integrated circuit design, the integrated circuit generator when executed replaces the provider interface with the component including wiring ports of the component, including the test port, in the second-level integrated circuit design according to the mapping.

2. The method of claim 1, further comprising:

configuring an application program interface (API) that enables a provider to communicate with the integrated circuit generator, wherein the provider utilizes the API to instantiate the provider interface and determine the mapping.

3. The method of claim 1, further comprising:

requesting, by the integrated circuit generator, the provider interface in the block; and providing, by a provider that communicates with the integrated circuit generator, the provider interface in the block.

4. The method of claim 1, further comprising:

receiving, by the integrated circuit generator, design parameters for the first-level integrated circuit design, wherein the design parameters specify the component.

5. The method of claim 1, wherein the first-level integrated circuit design corresponds to a language program used by the integrated circuit generator, and the second-level integrated circuit design corresponds to an intermediate representation (IR) data structure or a register-transfer level (RTL) data structure.

6. The method of claim 1, wherein the block is a level of a hierarchy, and the mapping to the provider interface is through multiple levels of the hierarchy.

7. The method of claim 1, wherein the component includes a first set of one or more ports and a second set of one or more ports, and the provider interface is instantiated in the block to provide access to the first set of one or more ports without wiring the second set of one or more ports.

8. The method of claim 1, wherein the component is a static random access memory (SRAM) having read and write ports and the test port, and the provider interface is instantiated in the block to provide access to the read and write ports without wiring the test port.

9. The method of claim 1, wherein the provider interface provides the placeholder for a generic component, and the integrated circuit generator when executed replaces the provider interface with a specific component.

10. An apparatus, comprising:

a memory; and a processor configured to execute instructions stored in the memory to:

determine a mapping to a provider interface in a block of a first-level integrated circuit design, the provider interface providing a placeholder for a component in the block without wiring at least one port of the component, the at least one port comprising a test port; and invoke an integrated circuit generator to generate a second-level integrated circuit design based on the first-level integrated circuit design, the integrated circuit generator when executed replaces the provider interface with the component including wiring ports of the component, including the test port, in the second-level integrated circuit design according to the mapping.

11. The apparatus of claim 10, wherein the processor is further configured to execute instructions stored in the memory to:

configure an application program interface (API) that enables a provider to communicate with the integrated circuit generator, wherein the provider utilizes the API to instantiate the provider interface and determine the mapping.

12. The apparatus of claim 10, wherein the processor is further configured to execute instructions stored in the memory to:

request, by the integrated circuit generator, the provider interface in the block; and provide, by a provider that communicates with the integrated circuit generator, the provider interface in the block.

13. The apparatus of claim 10, wherein the processor is further configured to execute instructions stored in the memory to:

receive, by the integrated circuit generator, design parameters that specify the component as corresponding to a particular technology process.

14. The apparatus of claim 10, wherein the second-level integrated circuit design corresponds to a netlist or a physical design.

15. The apparatus of claim 10, wherein the block is a register file implemented by a processor core that is implemented by an SoC, and the mapping to the provider interface is through processor core to the register file.

16. A non-transitory computer readable medium storing instructions operable to cause one or more processors to perform operations comprising:

determining a mapping to a provider interface in a block of a first-level integrated circuit design, the provider interface providing a placeholder for a component in the block without wiring at least one port of the component, the at least one port comprising a test port; and invoking an integrated circuit generator to generate a second-level integrated circuit design based on the first-level integrated circuit design, the integrated circuit generator when executed replaces the provider interface with the component including wiring ports of the component, including the test port, in the second-level integrated circuit design according to the mapping.

17. The non-transitory computer readable medium storing instructions of claim 16, the operations further comprising:

configuring an application program interface (API) that encapsulates logic to enable a provider to communicate with the integrated circuit generator, wherein the integrated circuit generator utilizes the API to request the provider interface from the provider.

18. The non-transitory computer readable medium storing instructions of claim 16, the operations further comprising:

requesting, by the integrated circuit generator, the provider interface in the block; and providing, by a provider that communicates with the integrated circuit generator, the provider interface in the block.

19. The non-transitory computer readable medium storing instructions of claim 16, the operations further comprising:

receiving, by the integrated circuit generator, design parameters for the first-level integrated circuit design, wherein the design parameters specify the component.

20. The non-transitory computer readable medium storing instructions of claim 16, wherein the component is a clock gate or a strap pin.

* * * * *